US009960240B2

(12) United States Patent
Adusumilli et al.

(10) Patent No.: US 9,960,240 B2
(45) Date of Patent: May 1, 2018

(54) LOW RESISTANCE CONTACT STRUCTURES FOR TRENCH STRUCTURES

(71) Applicant: INTERNATIONAL BUSINESS MACHINES CORPORATION, Armonk, NY (US)

(72) Inventors: Praneet Adusumilli, Albany, NY (US); Alexander Reznicek, Troy, NY (US); Oscar van der Straten, Guilderland Center, NY (US); Chih-Chao Yang, Glenmont, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days. days.

(21) Appl. No.: 14/919,201

(22) Filed: Oct. 21, 2015

(65) Prior Publication Data

US 2017/0117371 A1    Apr. 27, 2017

(51) Int. Cl.
| | |
|---|---|
| H01L 29/417 | (2006.01) |
| H01L 23/535 | (2006.01) |
| H01L 29/06 | (2006.01) |
| H01L 29/78 | (2006.01) |
| H01L 29/66 | (2006.01) |
| H01L 21/768 | (2006.01) |

(52) U.S. Cl.
CPC .. *H01L 29/41791* (2013.01); *H01L 21/76841* (2013.01); *H01L 21/76877* (2013.01); *H01L 21/76897* (2013.01); *H01L 23/535* (2013.01); *H01L 29/0649* (2013.01); *H01L 29/66795* (2013.01); *H01L 29/785* (2013.01)

(58) Field of Classification Search
CPC ......... H01L 29/41791; H01L 21/76841; H01L 21/76877; H01L 21/76987; H01L 23/535; H01L 29/0649; H01L 29/66795; H01L 29/785
See application file for complete search history.

(56) References Cited

U.S. PATENT DOCUMENTS

| | | | |
|---|---|---|---|
| 6,246,118 B1 | 6/2001 | Buynoski | |
| 6,744,138 B2 | 6/2004 | Marsh | |
| 6,855,630 B1 * | 2/2005 | Ruf | H01L 21/28518 257/E21.165 |
| 7,026,714 B2 | 4/2006 | Cunningham | |
| 7,695,981 B2 | 4/2010 | Dai et al. | |

(Continued)

OTHER PUBLICATIONS

List of IBM Patents or Patent Applications Treated as Related (2 pages).

(Continued)

*Primary Examiner* — Moazzam Hossain
*Assistant Examiner* — Farun Lu
(74) *Attorney, Agent, or Firm* — Tutunjian & Bitetto, P.C.; Vazken Alexanian

(57) ABSTRACT

An electrical device including at least one contact surface and an interlevel dielectric layer present atop the electrical device, wherein the interlevel dielectric layer includes at least one trench to the at least one contact surface of the electrical device. A conformal titanium liner is present on the sidewalls of the trench and is in direct contact with the at least one contact surface. The conformal titanium liner may be composed of 100 wt. % titanium, and may have a thickness ranging from 10 Å to 100 Å.

8 Claims, 6 Drawing Sheets

(56) References Cited

U.S. PATENT DOCUMENTS

| | | |
|---|---|---|
| 7,790,611 B2 | 9/2010 | Anderson et al. |
| 7,830,019 B2 | 11/2010 | Chanda et al. |
| 8,089,157 B2 | 1/2012 | Cabral, Jr. et al. |
| 8,435,887 B2 | 5/2013 | Kelly et al. |
| 8,659,156 B2 | 2/2014 | Yang et al. |
| 8,679,970 B2 | 3/2014 | Yang et al. |
| 8,802,559 B2 | 8/2014 | Yang et al. |
| 9,543,419 B1 | 1/2017 | Fan et al. |
| 2002/0006674 A1* | 1/2002 | Ma ............... H01L 21/31122 438/3 |
| 2007/0210448 A1* | 9/2007 | Wong ............... H01L 21/288 257/734 |
| 2007/0222066 A1* | 9/2007 | Cabral, Jr. ......... H01L 21/2885 257/734 |
| 2008/0083955 A1* | 4/2008 | Kanarsky ......... H01L 21/76829 257/382 |
| 2010/0216305 A1* | 8/2010 | Wada ............... H01L 21/28556 438/655 |
| 2012/0132990 A1 | 5/2012 | Zhu et al. |
| 2014/0145319 A1* | 5/2014 | Meinhold ............ H01L 23/492 257/676 |
| 2014/0210088 A1 | 7/2014 | Zhang et al. |
| 2014/0264867 A1 | 9/2014 | Kuo et al. |
| 2015/0262930 A1* | 9/2015 | Song ............... H01L 23/528 257/770 |

OTHER PUBLICATIONS

Office Action dated Jun. 2, 2017 issued in related U.S. Appl. No. 15/226,143, pp. 1-27.

* cited by examiner

LOW RESISTANCE CONTACT STRUCTURES FOR TRENCH STRUCTURES

BACKGROUND

Technical Field

The present disclosure relates to electrical devices, such as semiconductor field effect transistors. The present disclosure further relates to processing of materials suitable for the contacts to semiconductor devices.

Description of the Related Art

Semiconductor field effect transistors (FETs) continue to get smaller because of technological improvements in semiconductor fabrication processes. The technological improvements have enabled aggressive down-scaling of FETs, and the aggressive down-scaling has resulted in increased density of electrical components on integrated circuits. However, as FETs get smaller, challenges arise that can negatively impact their utility and performance. One challenge often encountered in semiconductor fabrication, which arises due to down-scaling of FETs, is the ability to provide FETs with low contact resistance. A contact is an interface material between a FET substrate and interconnect wiring, wherein the interconnect wiring is routed to connect a FET to other integrated circuit components distributed on the surface of the substrate. A contact can enhance electrical current flow (i.e., reduce resistance) between substrate and interconnect wiring. However, as surface area of contacts decrease, due to the aggressive down-scaling, contact resistance can increase and cause a reduction of FET performance, such as a reduction in transistor switching speed.

SUMMARY

In one embodiment, a method of forming a contact to an electrical device is provided that includes forming a titanium liner on sidewalls of a trench structure and a base surface of the trench provided by a contact surface of the electrical device; and filling the trench with a metal fill comprising ruthenium (Ru), rhodium (Rh), iridium (Ir), osmium (Os), molybdenum (Mo), copper (Cu) or a combination thereof.

In another aspect, an electrical device is provided that includes at least one contact surface and an interlevel dielectric layer present atop the electrical device, wherein the interlevel dielectric layer includes at least one trench to the at least one contact surface of the electrical device. In some embodiments, a conformal titanium liner is present on the sidewalls of the trench and is in direct contact with the at least one contact surface. A metal fill comprising ruthenium (Ru), rhodium (Rh), iridium (Ir), osmium (Os), molybdenum (Mo), copper (Cu) or a combination thereof fills the at least one trench, and is in direct contact with the conformal titanium liner.

In another embodiment, a semiconductor device is provided that includes a fin structure providing a channel region of the semiconductor device, wherein source and drain regions that are positioned on opposing sides of the channel region are present on source and drain portions of the fin structure. A gate structure may be present on the channel region of the semiconductor device. Contacts to at least the source regions and drain regions can include a conformal titanium liner that is present on the sidewalls of a trench through an interlevel dielectric to the source and drain regions, and a metal fill comprising ruthenium (Ru), rhodium (Rh), iridium (Ir), osmium (Os), molybdenum (Mo), copper (Cu) or a combination thereof.

In yet another aspect, the present disclosure provides a method of forming a contact to an electric device that includes forming a liner of tantalum or tantalum nitride on sidewalls of a trench structure and a base surface of the trench provided by a contact surface of the electrical device. An copper fill promoting liner comprising ruthenium (Ru), rhodium (Rh), iridium (Ir), osmium (Os), molybdenum (Mo), copper (Cu) or a combination thereof may then be formed on the liner of tantalum or tantalum nitride. A metal fill comprising a copper containing metal fills the at least one trench. In some embodiments, when the contact surface of the electrical device is not alloyed with a semiconductor material, e.g., not silicided, the liner of the tantalum or tantalum nitride may be in direct contact with the contact surface of the electrical device. In another embodiment, when the contact surface of the electrical device includes a metal and semiconductor alloy, such as titanium silicide, a semiconductor alloying layer may be formed between the contact surface of the electrical device and the liner of tantalum or tantalum nitride.

In another aspect of the present disclosure, an electrical device is provided that includes at least one contact surface and an interlevel dielectric layer present atop the electrical device, wherein the interlevel dielectric layer includes at least one trench to the at least one contact surface of the electrical device. A liner of tantalum or tantalum nitride can be present on sidewalls of the trench structure and a base surface of the trench provided by the contact surface of the electrical device. In some embodiments, an copper fill promoting liner comprising ruthenium (Ru), rhodium (Rh), iridium (Ir), osmium (Os), molybdenum (Mo), copper (Cu) or a combination thereof is in direct contact with the liner of tantalum or tantalum nitride. A metal fill comprising a copper containing metal fills the at least one trench and is present directly on the copper fill promoting liner. In some embodiments, when the contact surface of the electrical device is not alloyed with a semiconductor material, e.g., not silicided, the liner of the tantalum or tantalum nitride may be in direct contact with the contact surface of the electrical device. In another embodiment, when the contact surface of the electrical device includes a metal and semiconductor alloy, such as titanium silicide, a semiconductor alloying layer may be present between the contact surface of the electrical device and the liner of tantalum or tantalum nitride.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION OF THE PREFERRED EMBODIMENTS

Figure 1:
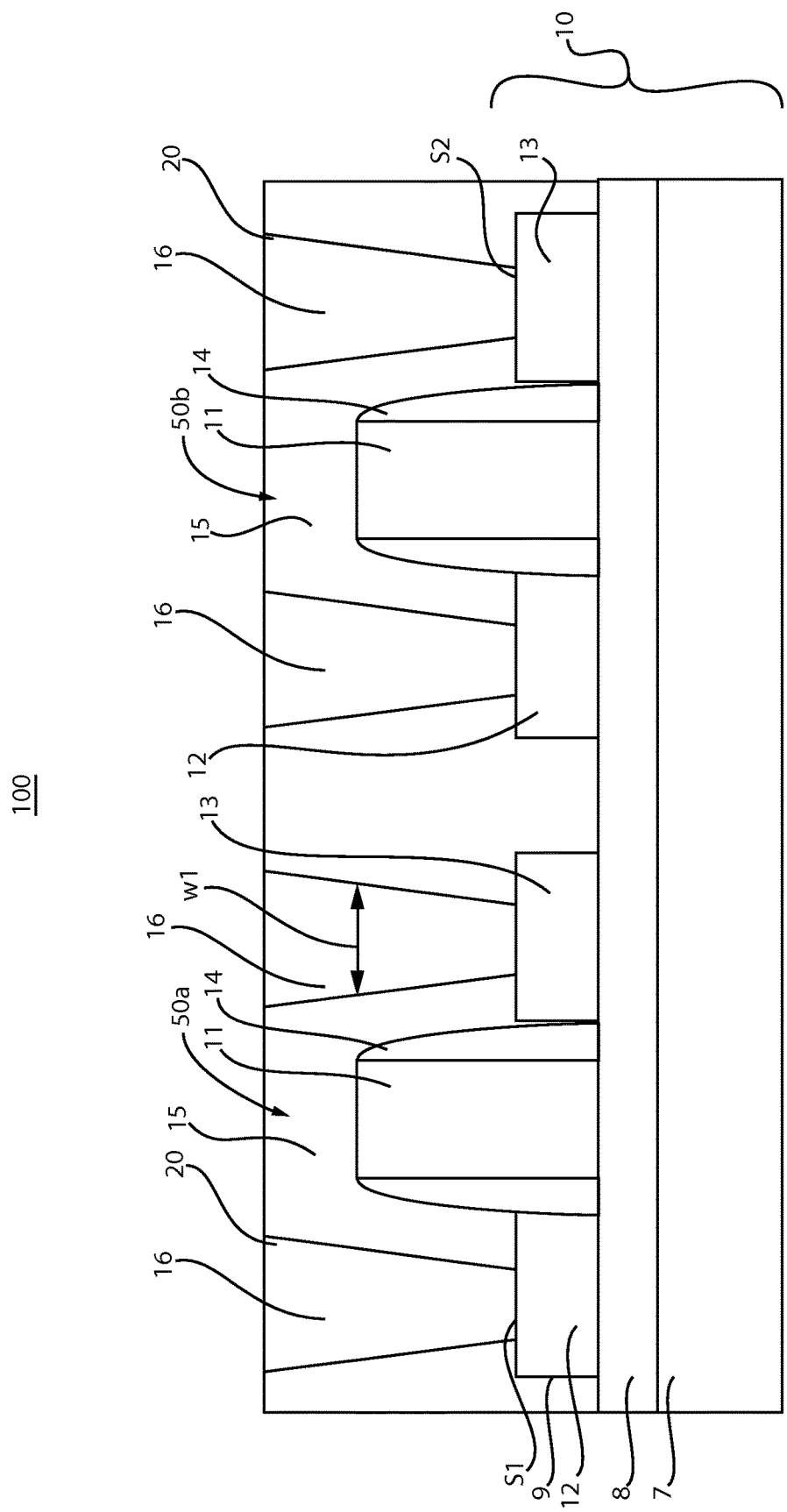
FIG. 1 is a side cross-sectional view depicting one embodiment to contact trenches to the conductive features of a semiconductor device, in accordance with present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein provide low resistance contact structures for middle of the line (MOL) trench contacts. Previously formed contacts to semiconductor devices composed of tungsten (W) typically employ a halide based tungsten (W) precursor, such as tungsten-hexafluoride. It has been determined that a tungsten or tungsten based fill requires a thick titanium nitride (TiN) diffusion barrier layer (also referred to as diffusion barrier liner), e.g., greater than 3 nm in thickness, to avoid fluorine diffusion and to avoid the attack of an underlayer, such as a titanium underlayer. With decreasing dimensions, and the requirement of a thicker titanium nitride (TiN) diffusion layer, it is evident that there is little space left in the contract trench for the deposition of the contact material, which can be especially true since the titanium nitride (TiN) diffusion layer does not scale proportionally with the rest of the device. Therefore, depositing a TiN diffusion barrier layer within a trench for forming a contact can leave very little room for the deposition of tungsten, which provides the electrically conductive portion of the contact that carries electrical signal to and from the semiconductor devices, which can disadvantageously result in a high resistance contact.

In accordance with at least some of the embodiments of the present disclosure, the methods and structures provided herein employ at least one of ruthenium (Ru), rhodium (Rh), iridium (Ir), osmium (Os), molybdenum (Mo), and copper (Cu) as the contact metal at the trench silicide (TS) level, i.e., contact to the source and drain region, of semiconductor devices. Middle of the line (MOL) structures are also provided that can prevent diffusion and enable low resistivity metal fills for contacts. In some examples, ruthenium can be used as copper (Cu) fill enhancement layer or copper (Cu) reflow enhancement layer. In other examples, instead of only employing a liner of ruthenium (Ru), rhodium (Rh), iridium (Ir), osmium (Os), or molybdenum (Mo), the methods and structures that are disclosed herein propose to fill the whole contact trench with at least one of ruthenium (Ru), rhodium (Rh), iridium (Ir), osmium (Os), or molybdenum (Mo), since these materials are suitable low resistivity metals for providing contacts. In another approach, the methods and structure of the present disclosure use copper (Cu). The methods and structures of the present disclosure are now described with greater detail referring to FIGS. 1-6.

FIG. 1 illustrates a cross-sectional view of an electrical device 100 including semiconductor devices 50a, 50b. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. In some examples, the field effect transistor may be a planar device. In a planar device the gate structure is formed atop an upper surface of the substrate that provides the channel region of the device, in which source and drain regions are present on the substrate on opposing sides of the channel region. In other embodiments, the semiconductor device may be a FinFET semiconductor device. In a FinFET semiconductor device the channel region of the semiconductor device is present in a fin structure. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure.

In the embodiment that is depicted in FIG. 1, the electrical device 100 includes two semiconductor devices, e.g., a first semiconductor device 50a having a first conductivity type, such as n-type conductivity, e.g., n-FinFET, and a second semiconductor device having a second conductivity type, such as a p-type conductivity, e.g., p-FinFET. Although the semiconductor devices provided are FinFETs, in which the fin structures are formed from the semiconductor on insulator (SOI) layer of a semiconductor on insulator (SOI) substrate, the present disclosure is not limited to only this example. Any semiconductor device may provide the contact surface that the contacts are formed to. For example, the semiconductor device may be a planar FET or may be a bipolar junction transistor. In other examples, it is not necessary that the contacts disclosed herein are formed to semiconductor devices, as any electrical device is suitable for use with the methods and structures disclosed herein, such as memory devices, e.g., RAM, MRAM and flash memory, and passive devices, e.g., resistors and capacitors.

Referring to FIG. 1, the semiconductor devices 50a, 50b may be present on a substrate 10, e.g., semiconductor substrate. For example, the first semiconductor device 50a may be present in a first region of the substrate 10 and the second semiconductor device 50b may be present in a second region of the substrate 10. In the embodiment that is depicted in FIG. 1, the semiconductor devices 50a, 50b are FinFETs, in which the fin structures 9 are provided by the semiconductor on insulator (SOI) layer of an SOI substrate. In this example, the SOI layer has been patterned and etched to provide the fin structures 9, wherein the SOI layer may be a semiconductor material, such as silicon (Si). It is noted, that silicon (Si) as a material for the fin structures 9 is only one example of a suitable semiconductor material for the fin structures 9. It is not intended that the present disclosure be limited to only this example, as any type IV semiconductor, e.g., including germanium containing semiconductors, and type III-V compound semiconductor materials, e.g., gallium arsenic, can be suitable for the fin structures. The SOI layer that provides the fin structure 9 may be present atop a dielectric layer 8 that can be referred to as a buried oxide (BOX) layer. In one example, the dielectric layer 8 can be composed of silicon oxide, but other dielectrics may be equally suitable. A supporting substrate 7 can be present underlying the dielectric layer 8, which can be composed of a semiconductor material that is the same or different from the SOI layer. For example, the supporting substrate 7 may be composed of a silicon containing material, such as silicon (Si).

It is noted that it is not necessary that the substrate used for forming the semiconductor devices 50a, 50b be an SOI substrate. For example, the substrate 7 may be a bulk substrate. Further, as noted above, the substrate 7 is not necessarily processed to provide a fin structure including semiconductor device, as the semiconductor devices that may incorporate the contacts of the present disclosure may be any type of semiconductor device, e.g., planar FETs.

In the embodiment that is depicted in FIG. 1, each of the semiconductor devices 50a, 50b may include a gate structure 11, a source region 12 and a drain region 13. The gate structure 11 may further include a gate dielectric and a gate conductor that is composed of poly-silicon and/or metal layer. The gate dielectric layer can comprise an oxide, such as silicon dioxide, hafnium oxide, zirconium oxide, or a combination thereof, such as hafnium oxide disposed on silicon dioxide. The gate dielectric layer can be deposited on a channel portion of the fin structures 9 utilizing a variety of deposition techniques, which can include chemical vapor deposition (CVD), or atomic layer deposition (ALD). The gate conductor can comprise a metal layer that can include, but is not limited to, aluminum (Al), hafnium (Hf), lanthanum (La), tantalum (Ta), titanium (Ti), or zirconium (Zr). The metal layer for the gate conductor can be deposited on the gate dielectric layer utilizing a CVD technique, a physical vapor deposition (PVD) technique, or any other deposition technique. Furthermore, in some embodiments, if a gate conductor comprises a metal layer, a poly-silicon layer can be deposited on the metal layer. Subsequent to formation of poly-silicon and/or metal layer, a gate dielectric spacer 14 may be formed on the sidewalls of the gate structure 11. The gate dielectric spacer 14 can comprise nitride, oxide, or any other dielectric material.

The source region 12 and drain region 13 are present on opposing sides of the channel region that the gate structure 11 is present on. The source and drain regions 12, 13 are typically doped to a conductivity type that provides the conductivity type of the semiconductor device 50a, 50b. For example, the source region 12 and drain region 13 of the first semiconductor device 50a may be doped n-type to provide an n-type FinFET, and the source region 12 and drain region 13 of the second semiconductor device 50b may be doped p-type to provide a p-type FinFET. In the embodiment that is depicted in FIG. 1, the source region 12 and drain region 13 may be formed on the source and drain region portions of the fin structure 9.

In one embodiment, the source regions 12 and drain regions 13 may be formed using an epitaxial growth process to form in-situ n-type or p-type doped semiconductor material on the source and drain region portions of the fin structures 9 followed by annealing, wherein the annealing can cause the dopants from the in-situ n-type or p-type epitaxial semiconductor material to diffuse into the source and drain region portions of the fin structures 9. The source regions 12 and drain regions 13 may also be formed using ion implantation. Forming the gate structures 11 prior to forming the source and drain regions 12, 13 is known as gate first processing. The methods disclosed herein are not limited to only this example, as gate last processing may also be employed to form the semiconductor devices 50a, 50b. In gate last processing, a dummy gate is formed on the channel region of the semiconductor device; the source and drain regions are formed; the dummy gate is removed; and a functional gate structure is formed in the space previously occupied by the dummy gate.

Still referring to FIG. 1, following formation of the semiconductor devices 50a, 50b, an interlevel dielectric layer 15 is formed. The interlevel dielectric layer 15 may be blanket deposited over the semiconductor devices 50a, 50b. The interlevel dielectric layer 15 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). Additional choices for the interlevel dielectric layer 15 include any of the aforementioned materials in porous form, or in a form that changes during processing to or from being porous and/or permeable to being non-porous and/or non-permeable. The interlevel dielectric layer 15 may be deposited over the semiconductor devices 50a, 50b utilizing chemical vapor deposition (CVD), wherein the type of CVD can include plasma enhanced chemical vapor deposition (PECVD), metal organic CVD (MOCVD), low pressure CVD or flowable CVD. Spin on deposition may also be used to deposit some compositions of the interlevel dielectric layer 15.

FIG. 1 illustrates the formation of openings 16 (also referred to as trenches 16) through the interlevel dielectric 15 to the source and drain region 12, 13 of the semiconductor devices 50a, 50b. The trenches 16 may be formed by employing an etch process, such as an anisotropic etch process, e.g., reactive ion etch (RIE). It is noted that reactive ion etch (RIE) is only one example of an etch process that is suitable for forming the trenches 16. Other etch processes for forming the trenches 16 through the interlevel dielectric layer 15 may include wet etching, dry etching, plasma etching, isotropic RIE, anisotropic RIE, ion milling, or any combination thereof.

In some embodiments, the trenches 16 may expose an upper surface of the source region 12 and drain region 13 of the semiconductor devices 50a, 50b, wherein the width W1 of the trenches 16 may range from 10 nm to 60 nm. In another embodiment, the trenches 16 may have a width ranging from 15 nm to 30 nm.

FIGS. 1-4 depict one embodiment of a method that forms contacts 200a to an electrical device 50a, 50b, in which the contacts 200a are composed of a conformal titanium liner 20 and a fill 25 that is composed of at least one of ruthenium (Ru), rhodium (Rh), iridium (Ir), osmium (Os), molybdenum (Mo), copper (Cu) or a combination thereof. The contacts 200a are formed in the trenches 16 that extend through the interlevel dielectric layer 15 to the at least one contact surface S1, S2 of the electrical device 50a, 50b. In some embodiments, a conformal titanium liner 20 is present on the sidewalls of the trench 16, and is in direct contact with the at least one contact surface S1, S2. The metal fill 25 is in direct contact with the conformal titanium liner 20.

Figure 2:
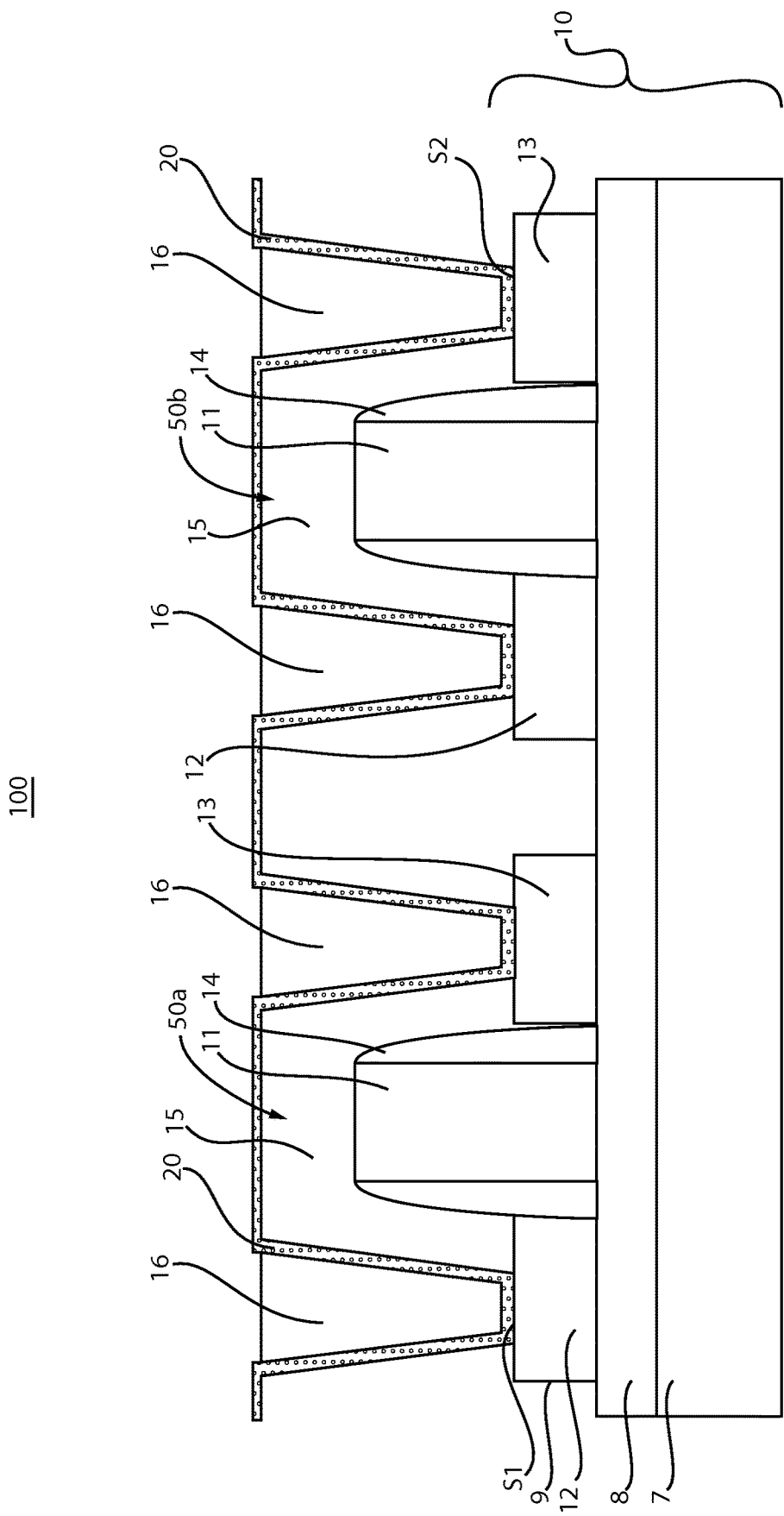
FIG. 2 is a side cross-sectional view depicting one embodiment of depositing a titanium liner layer in the contact trenches that are depicted in FIG. 1, in accordance with one embodiment of the present disclosure.

FIG. 2 depicts one embodiment of depositing a titanium liner layer 20 in the contact trenches, i.e., openings 16 through the interlevel dielectric layer 15, which are depicted in FIG. 1. The titanium liner layer 20 may be used to form a metal semiconductor alloy, e.g., silicide, on the contact surfaces S1, S2 of the source region 12 and drain region 13 of the semiconductor devices 50a, 50b. For example, when the fin structures 9 are composed of a silicon containing material, such as silicon (Si), the silicide formed on the contact surfaces S1, S2 that are in direct contact with the titanium liner layer 20 may be titanium silicide. It is noted that titanium silicide is only one example of a metal semiconductor alloy that may be present on the contact surfaces S1, S2. It has been contemplated that other metals may be present in the metal semiconductor alloy. For example, the metal semiconductor alloy may comprise silicides with refractory metals (e.g., nickel, platinum, or cobalt), rare-earth metals (e.g., erbium, dysprosium, yttrium), and/or a different phase orientation, and/or a different ternary form of silicides, and/or a combination thereof.

The titanium liner layer 20 can be composed of entirely of titanium (Ti). For example, the titanium liner layer 20 may be 100 wt. % titanium. The titanium liner layer 20 is typically a conformally deposited layer. The titanium liner layer 20 is conformally deposited on at least the sidewalls of the trenches 16, and the contact surfaces S1, S2 at the base of the trenches 16. In the embodiment that is depicted in FIG. 2, the titanium liner layer 20 is also deposited atop the interlevel dielectric layer 15 between the trenches 16, i.e., openings through the interlevel dielectric layer 15. The term "conformal" and "conformally deposited" denotes a layer having a thickness that does not deviate from greater than or less than 30% of an average value for the thickness of the layer. In one embodiment, the thickness of the titanium liner layer 20 may be less than 100 Å. In another embodiment, the thickness of the titanium liner layer 20 may range from 10 Å to 30 Å.

The titanium liner layer 20 may be deposited using a deposition method, such as physical vapor deposition (PVD), chemical vapor deposition (CVD) or atomic layer deposition. (ALD). Examples of PVD suitable for forming the titanium liner layer 20 include plating, electroplating, electroless plating, sputtering and combinations thereof. Examples of sputtering apparatus that may be suitable for depositing the titanium liner layer 20 include DC diode type systems, radio frequency (RF) sputtering, magnetron sputtering and ionized metal plasma (IMP) sputtering.

As noted above, the titanium liner layer 20 when subjected to an anneal process can form a metal semiconductor alloy with the semiconductor material of the contact surface S1, S2 of the semiconductor devices 50a, 50b.

Figure 3:
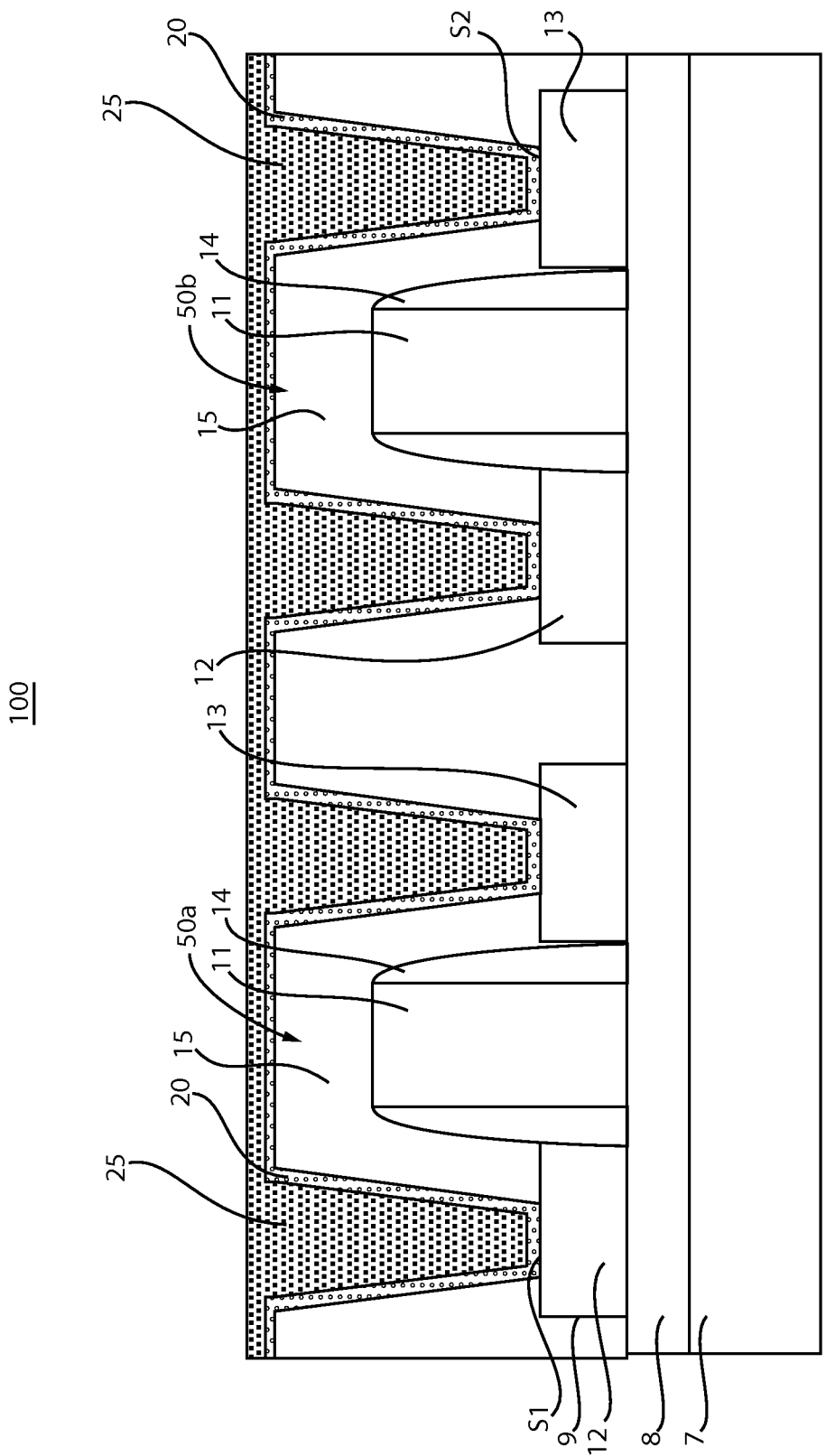
FIG. 3 is a side cross-sectional view depicting one embodiment of depositing a ruthenium containing fill atop the titanium liner that is depicted in FIG. 2.

FIG. 3 depicts one embodiment of depositing a ruthenium (Ru) containing fill atop the titanium liner layer 20 that is depicted in FIG. 2. It is noted that the ruthenium provides the majority of the contact metal for the contact 200a. Other metals besides ruthenium (Ru) or may be alloyed with ruthenium (Ru) at this stage of the present disclosure. Some examples of metals may be alloyed with or substituted for ruthenium (Ru) include rhodium (Rh), iridium (Ir), osmium (Os), and molybdenum (Mo). These metals provide a substitute for conventional tungsten (W), which typically requires deposition using tungsten based precursors, such as tungsten-hexafluoride, which typically also requires the use of a thick titanium nitride (TiN) diffusion barrier. The use of the thick titanium nitride (TiN) layer and tungsten (W) CVD deposition disadvantageously limits the amount of contact metal that can be deposited in the vias. The use of the titanium liner layer 20 and metal fill 25 comprising ruthenium (Ru), rhodium (Rh), iridium (Ir), osmium (Os), molybdenum (Mo), copper (Cu) or a combination thereof overcomes the difficulties of the prior TiN/W contact by allowing for complete fill of smaller trenches.

In some embodiments, the metal fill 25 comprising ruthenium (Ru), rhodium (Rh), iridium (Ir), osmium (Os), molybdenum (Mo), copper (Cu) or a combination thereof may be deposited using a physical vapor deposition method. The use of the aforementioned metals can allow for eliminating the need for halide based CVD precursors by employing PVD deposition. PVD deposition methods suitable for forming the metal fill 25 comprising ruthenium (Ru), rhodium (Rh), iridium (Ir), osmium (Os), molybdenum (Mo), copper (Cu) or a combination thereof may include plating, electroplating, electroless plating, sputtering and combinations thereof. Examples of sputtering apparatus that may be suitable for depositing the titanium liner layer 20 include DC diode type systems, radio frequency (RF) sputtering, magnetron sputtering, and ionized metal plasma (IMP) sputtering. In some embodiments, the metal fill 25 comprising ruthenium (Ru), rhodium (Rh), iridium (Ir), osmium (Os), molybdenum (Mo), copper (Cu) or a combination thereof may be deposited using a PVD reflow method. In PVD reflow, and initial layer of metallic material is first deposited using a process such as sputtering, wherein after the initial deposition the deposited material is heated to a softening point at which the material fill the openings via capillary action. In some embodiments, after the initial deposition of a conformal or super-conformal film via sputter deposition, heating to a reflow point is conducted at which surface diffusion helps the material flow into the via or trench opening. In other examples, deposition of metal via sputter deposition is performed at an elevated temperature at which surface diffusion helps the material flow into the via or trench opening. This process can be done on top of a reflow enhancement layer.

In some embodiment, the metal fill 25 comprising ruthenium (Ru), rhodium (Rh), iridium (Ir), osmium (Os), molybdenum (Mo), copper (Cu) or a combination thereof may fill the entirety of the openings 16, and the metal fill 25 may be in direct contact with the titanium liner layer 20 that is present directly on the sidewalls of the openings 16 and the contact surfaces S1, S2 of the source region 12 and drain region 13. In some embodiments, the metal fill 25 is deposited to overfill the trenches 16 and extend onto the upper surfaces of the interlevel dielectric layer 15 that is present between the trenches 16, i.e., openings through the interlevel dielectric layer 15.

Figure 4:
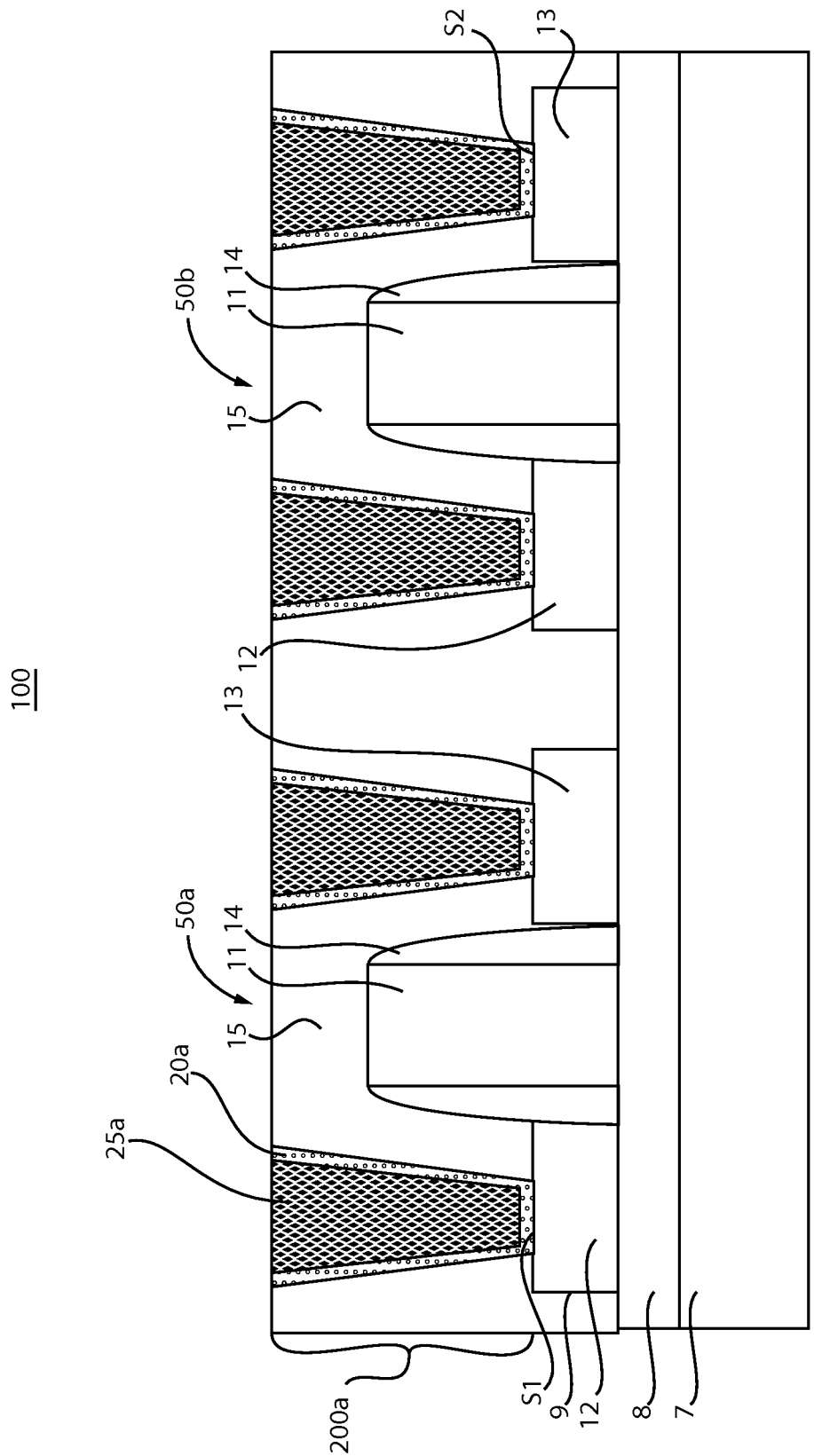
FIG. 4 is a side cross-sectional view depicting planarizing the structure depicted in FIG. 3, in accordance with one embodiment of the present disclosure.

FIG. 4 depicts planarizing the structure depicted in FIG. 3 so that the upper surface of the metal fill 25 is coplanar with the upper surface of the interlevel dielectric layer 15. As depicted in FIG. 4, the planarization process removes the portion of the metal fill 25 comprising ruthenium (Ru), rhodium (Rh), iridium (Ir), osmium (Os), molybdenum (Mo), copper (Cu) or a combination thereof that is present overlying the interlevel dielectric layer 15. The planarization process also removes the portion of the titanium liner layer 20 that is present overlying the interlevel dielectric layer 15 between trench structures 16. The planarization process may be provided by chemical mechanical planarization (CMP).

The methods described above with reference to FIGS. 1-4 may provide an electrical device 100 that includes at least one contact surface S1, S2 and an interlevel dielectric layer 15 present atop the electrical device 100, wherein the interlevel dielectric layer 15 includes at least one trench 16 to the at least one contact surface S1 of the electrical device 100. In some embodiments, a conformal titanium liner 20 is present on the sidewalls of the trench 16 and is in direct contact with the at least one contact surface S1, S2. A metal fill 25 comprising ruthenium (Ru), rhodium (Rh), iridium (Ir), osmium (Os), molybdenum (Mo), copper (Cu) or a combination thereof fills the at least one trench 16, and is in direct contact with the conformal titanium liner 20.

As noted above, the titanium liner layer 20 may contribute to silicidation of the contact surfaces S1, S2 of the semiconductor devices 50a, 50b. Silicidation, i.e., metal and semiconductor intermixing to form a metal semiconductor alloy, may include and anneal process. The anneal process for silicidation may include furnace e annealing, rapid thermal annealing, and/or laser annealing, which can be conducted at any stage of the aforementioned process flow.

Figure 5:
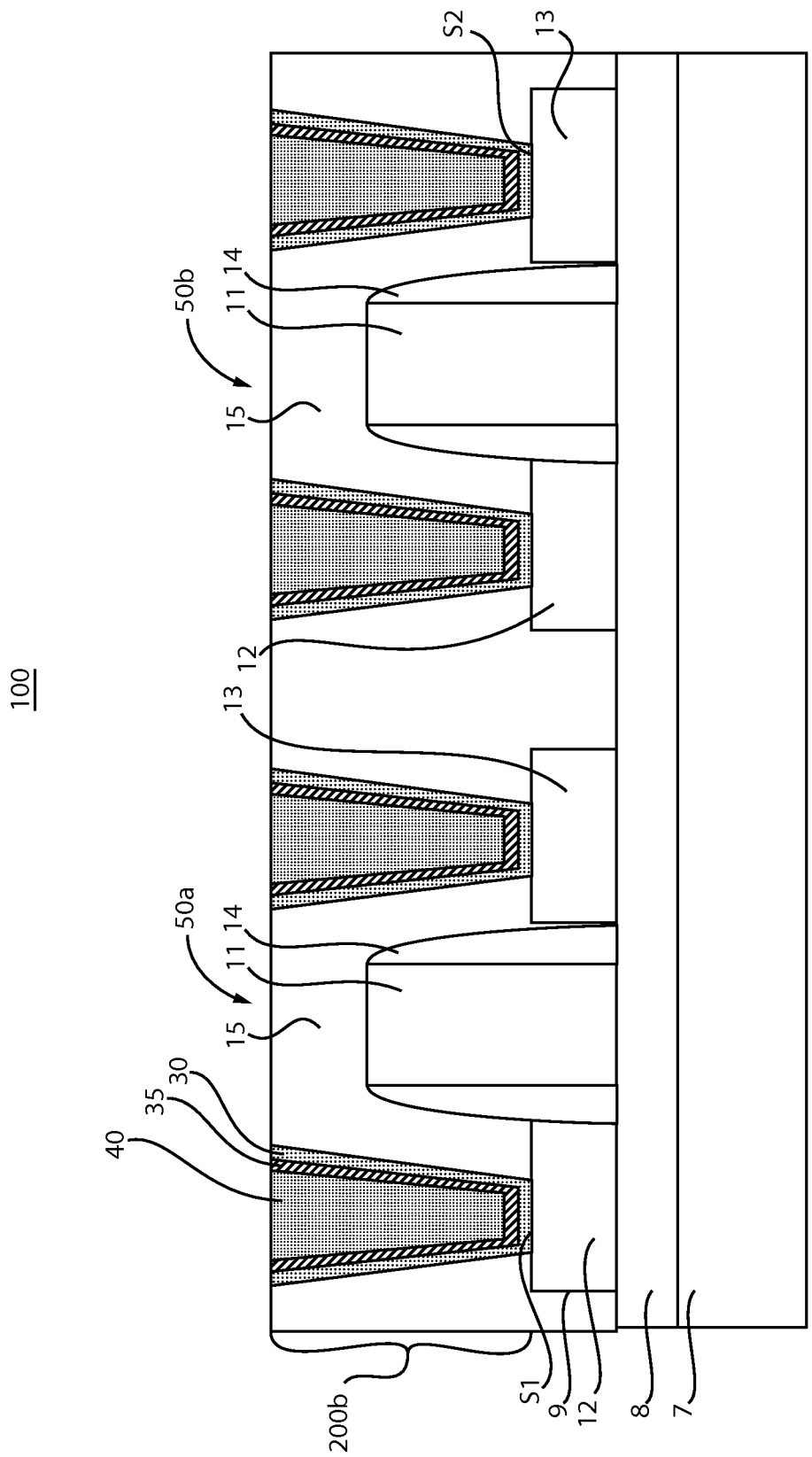
FIG. 5 is a side cross-sectional view depicting another embodiment of the present disclosure in which a contact is composed of a tantalum (Ta) or tantalum nitride (TaN) diffusion barrier, a ruthenium liner (Ru) and a copper (Cu) fill material.

FIG. 5 depicts another embodiment of the present disclosure, in which a contact 200b is provided that is composed of a tantalum (Ta) or tantalum nitride (TaN) diffusion barrier liner 30, a ruthenium (Ru) liner 35 and a copper (Cu) fill material 40. The contact 200b is present within a trench 16 through an interlevel dielectric layer 15 to the contact surfaces S1, S2 of semiconductor devices 50a, 50b that are present underlying the interlevel dielectric layer 15. The semiconductor devices 50a, 50b, the interlevel dielectric layer 15 and the openings 16 have been described above with reference to FIG. 1. The tantalum (Ta) or tantalum nitride (TaN) diffusion barrier liner 30 and the ruthenium (Ru) liner 35 may be conformal layers.

In the embodiment that is depicted in FIG. 5, the metal of the fill material that provides the contact metal is copper (Cu), which when deposited using electrochemical copper plating methods has better gap fill performance than tungsten (W) contacts that are formed using chemical vapor deposition. In other examples, the copper (Cu) fill material may be deposited using a copper reflow method atop a ruthenium (Ru) liner 35, in which the ruthenium (Ru) liner 35 provides for a copper fill enhancement. The tantalum (Ta) or tantalum nitride (TaN) diffusion barrier liner 30 may function as a barrier to the diffusion of copper from the copper (Cu) fill material 40.

The method of forming the contact 200b depicted in FIG. 5 may begin with depositing a tantalum (Ta) or tantalum nitride (TaN) diffusion barrier liner 30 on the sidewalls of the trench 16, as well as the base of the trench 16 that is provided by the contact surfaces S1, S2 of the semiconductor devices 50a, 50b. The tantalum (Ta) or tantalum nitride (TaN) diffusion barrier liner 30 may be blanket deposited top the structure depicted in FIG. 1, and similar to the titanium liner layer 20 depicted in FIG. 2 can be a conformal layer that is also formed on the upper surface of the interlevel dielectric layer 15 between the trenches 16.

The tantalum (Ta) or tantalum nitride (TaN) diffusion barrier liner 30 may be deposited using a physical vapor deposition method, such as plating, electroplating, and sputtering. The tantalum (Ta) or tantalum nitride (TaN) diffusion barrier liner 30 may also be formed using other deposition methods, such as atomic layer deposition (ALD). The thickness of the tantalum (Ta) or tantalum nitride (TaN) diffusion barrier liner 30 may range from 30 Å to 50 Å. In another embodiment, the thickness of the tantalum (Ta) or tantalum nitride (TaN) diffusion barrier liner 30 may range from 10 Å to 30 Å.

In this embodiment, silicidation of the contact surfaces S1, S2 is not required to be aided by the metal being deposited in the trenches 16 during the process sequence of forming the contacts 200b. Therefore, the tantalum (Ta) or tantalum nitride (TaN) diffusion barrier liner 30 may be formed directly on top of the contact surfaces S1, S2 of the semiconductor devices 50a, 50b. In some embodiments, a metal semiconductor alloy, e.g., silicide, may have been formed on the contact surfaces S1, S2 of the semiconductor devices 50a, 50b before the tantalum (Ta) or tantalum nitride (TaN) diffusion barrier liner 30 is deposited. Examples of silicides suitable at this stage of the present disclosure include titanium silicide, refractory metals (e.g., nickel, platinum, or cobalt), rare-earth metals (e.g., erbium, dysprosium, yttrium), and/or a different phase orientation, and/or a different ternary form of silicides, and/or a combination thereof.

Following formation of the tantalum (Ta) or tantalum nitride (TaN) diffusion barrier liner 30, a ruthenium (Ru) liner 35 (also referred to as copper fill enhancing liner 30) may be deposited within the trenches 16. The ruthenium (Ru) liner 35 may be employed as a copper fill enhancement material layer or a copper reflow enhancement material. The ruthenium (Ru) liner 35 may be composed of 100 wt. % ruthenium (Ru). In other embodiments, the ruthenium (Ru) liner 35 may also be composed of rhodium (Rh), iridium (Ir), osmium (Os), molybdenum (Mo) and a combination thereof. In yet other embodiments, the ruthenium (Ru) may be substituted with one of rhodium (Rh), iridium (Ir), osmium (Os), and molybdenum (Mo). The ruthenium (Ru) liner 35, as well as the above noted substitutes for the Ru liner 35, may be referred to as a copper fill promoting liner 35. It is noted that the above noted elements for the copper fill promoting liner 35 are provided for illustrative purposes only, and are not intended to limit the present disclosure, as other metals can be equally suitable.

The ruthenium (Ru) liner 35 may be deposited using a physical vapor deposition method, such as plating, electroplating, and sputtering. The ruthenium (Ru) liner 35 may also be formed using other deposition methods, such as atomic layer deposition (ALD). The thickness of the ruthenium (Ru) liner 35 may range from 30 Å to 50 Å. In another embodiment, the ruthenium (Ru) liner 35 may range from 10 Å to 30 Å. The ruthenium (Ru) liner layer 35 may be a conformally deposited layer.

Following deposition of the ruthenium (Ru) liner 35, the trenches 16 may be filled with a copper (Cu) fill material 40. The copper (Cu) fill material 40 may comprise 100 wt. % copper. The copper (Cu) fill material 40 may be deposited using a physical vapor deposition method. For example, the copper (Cu) fill material may be deposited using plating, electroplating, electroless deposition, copper reflow processing or a combination thereof. Copper reflow is a PVD deposition process, in which an initial layer of copper (Cu) is first deposited using a process such as plating or sputtering, wherein after the initial deposition the deposited material is heated to a softening point at which the material fill the openings via capillary action.

Following deposition of the copper (Cu) fill material 40, the structure may be planarized to provide that the upper surface of the copper (Cu) fill material 40 is coplanar with the upper surface of the interlevel dielectric layer 15, as depicted in FIG. 5. The planarization process may also remove the portions of the ruthenium (Ru) liner 35 and the tantalum (Ta) or tantalum nitride (TaN) diffusion barrier liner 30 from the upper surface of the interlevel dielectric layer 15. The planarization process may include chemical mechanical planarization (CMP).

Figure 6:
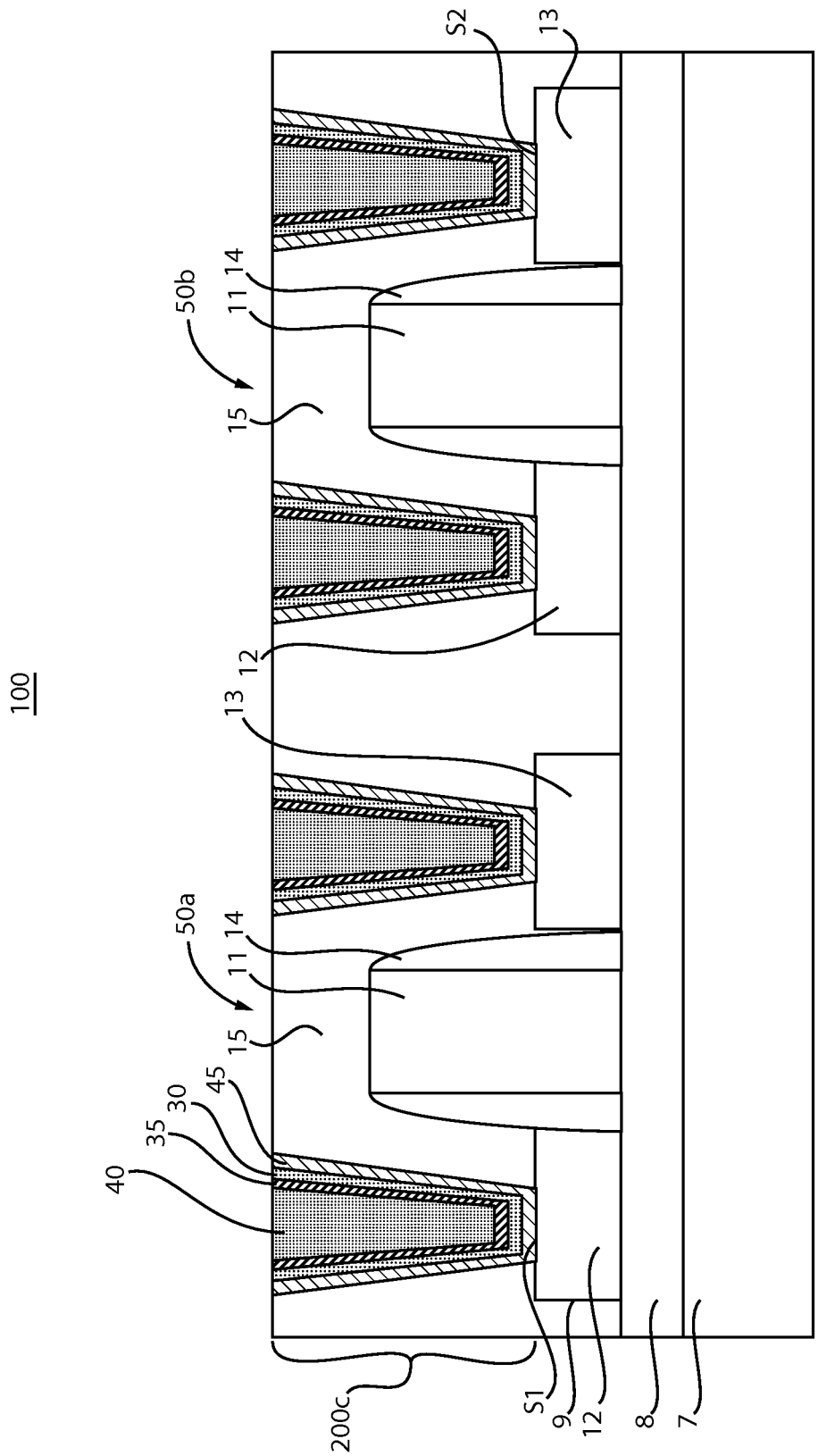
FIG. 6 is a side cross-sectional view depicting another embodiment of the present disclosure in which a contact is composed of a titanium layer for silicidation of an underlying structure, a tantalum (Ta) or tantalum nitride (TaN) diffusion barrier, a ruthenium liner (Ru) and a copper (Cu) fill material.

FIG. 6 depicts another embodiment of the present disclosure, in which a contact 200c is composed of a titanium liner layer 45 for silicidation of an underlying structure, a tantalum (Ta) or tantalum nitride (TaN) diffusion barrier 30, a ruthenium liner (Ru) 35 (also referred to as copper fill promoting layer 35) and a copper (Cu) fill material 40. The contact 200c that is depicted in FIG. 6 is formed in trenches 16 through an interlevel dielectric 15 that extend to semiconductor devices 50a, 50b. The trenches 16, interlevel dielectric 15 and the semiconductor devices 50, 50b have been described above with reference to FIG. 1.

The titanium liner layer 45 that is depicted in FIG. 6 is similar to the titanium liner layer 20 that is described above with reference to FIG. 2. Therefore, the above description of the titanium liner layer 20 that is provided with reference to FIG. 2 is equally applicable for describing at least one embodiment of the titanium liner layer 45 that is depicted in FIG. 6. As noted above, the titanium liner layer 45 may provide a metal that can contribute to the formation of a metal semiconductor alloy with the contact surfaces S1, S2 of the semiconductor devices 50a, 50b. For example, the metal semiconductor alloy that is formed using the titanium liner layer 45 may be a silicide, e.g., titanium silicide. An anneal process for interdiffusing the metal from the titanium liner layer and a semiconductor element from the contact surfaces S1, S2 of the semiconductor devices may be executed at this stage of the present disclosure or following the formation of any of the tantalum (Ta) or tantalum nitride (TaN) diffusion barrier 30, the ruthenium liner (Ru) 35 or the copper (Cu) fill material 40.

The tantalum (Ta) or tantalum nitride (TaN) diffusion barrier 30 that is depicted in FIG. 6 is similar to the tantalum (Ta) or tantalum nitride (TaN) diffusion barrier 30 that is described above with reference to FIG. 5. Therefore, the above description of the tantalum (Ta) or tantalum nitride (TaN) diffusion barrier 30 that is described with reference to FIG. 5 is equally applicable for describing at least one embodiment of the tantalum (Ta) or tantalum nitride (TaN) diffusion barrier 30 that is depicted in FIG. 6. For example, the thickness of the tantalum (Ta) or tantalum nitride (TaN) diffusion barrier liner 30 may range from 30 Å to 50 Å. In another embodiment, the thickness of the tantalum (Ta) or tantalum nitride (TaN) diffusion barrier liner 30 may range from 10 Å to 30 Å.

The ruthenium liner (Ru) 35 that is depicted in FIG. 6 is similar to the ruthenium liner (Ru) 35 that is described above with reference to FIG. 5. Therefore, the above description of the ruthenium liner (Ru) 35 that is described with reference to FIG. 5 is equally applicable for describing at least one embodiment of the ruthenium liner (Ru) 35 that is depicted in FIG. 6. For example, the ruthenium (Ru) liner 35 may be employed as a copper fill enhancement material layer or a copper reflow enhancement material. The ruthenium (Ru) liner 35 may be composed of 100 wt. % ruthenium (Ru). In other embodiments, the ruthenium (Ru) liner 35 may also be composed of rhodium (Rh), iridium (Ir), osmium (Os), molybdenum (Mo) and a combination thereof. In yet other embodiments, the ruthenium (Ru) may be substituted with one of rhodium (Rh), iridium (Ir), osmium (Os), and molybdenum (Mo). The ruthenium (Ru) liner 35 may be deposited using a physical vapor deposition method, such as plating, electroplating, and sputtering. The ruthenium (Ru) liner 35 may also be formed using other deposition methods, such as atomic layer deposition (ALD). The thickness of the ruthenium (Ru) liner 35 may range from 30 Å to 50 Å. In another embodiment, the ruthenium (Ru) liner 35 may range from 10 Å to 30 Å.

Referring to FIG. 6, following deposition of the ruthenium (Ru) liner 35, the trenches 16 may be filled with a copper (Cu) fill material 40. The copper (Cu) fill material 40 may comprise 100 wt. % copper. The copper (Cu) fill material 40 may be deposited using a physical vapor deposition method. For example, the copper (Cu) fill material 40 may be deposited using plating, electroplating, electroless deposition, copper reflow processing or a combination thereof. Copper reflow is a PVD deposition process, in which an initial layer of copper (Cu) is first deposited using a process such as plating or sputtering, wherein after the initial deposition the deposited material is heated to a softening point at which the material fill the openings via capillary action. A planarization process, such as CMP, may remove the portions of the copper (Cu) fill material 40, the tantalum (Ta) or tantalum nitride (TaN) diffusion barrier liner 30, and the ruthenium (Ru) liner 35 that is present on the interlevel dielectric layer 15 between trenches 16, as described above with reference to FIG. 5.

The above noted contacts are low resistance contacts. As used herein, the term low resistance denotes a resistivity for the contacts having an average area of approximately 700 $nm^2$ of 45 micro ohms per cm or less. In some embodiments, the resistivity for the contacts 200a, 200b, 200c that are described above with reference to FIGS. 1-6, is 40 micro ohms per cm or less, in which the contacts have an average area of approximately 700 $nm^2$.

The methods and structures that have been described above with reference to FIGS. 1-7 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a contact to an electrical device comprising:

forming a substantially nitrogen free titanium liner having in direct contact with sidewalls of a trench composed of an interlayer dielectric, and a base surface of the trench provided by a contact surface of the electrical device comprising silicon (Si);

filling an entirety of the trench with a single composition metal fill comprising ruthenium (Ru) containing material, the single composition metal fill being in direct contact with the substantially nitrogen free titanium liner; and after filling the entirety of the trench, alloying the substantially nitrogen free conformal titanium layer with the contact surface to provide a titanium containing silicide, the nitrogen free conformal titanium layer providing both a deposition surface for the metal fill and a silicide forming element.

2. The method of claim 1, wherein the titanium liner comprises 100 wt. % titanium.

3. The method of claim 1, wherein the titanium liner comprises a thickness ranging from 10 Å to 100 Å.

4. The method of claim 1, wherein a deposition process for forming the titanium liner comprises plating, electroplating, electroless plating, sputtering, chemical vapor deposition or a combination thereof.

5. The method of claim 1, wherein the titanium liner provides a metal element for siliciding the contact surface of the electrical device.

6. The method of claim 1, wherein the contact surface is at least one of a source region surface and a drain region surface, and the electrical device comprises a semiconductor device.

7. The method of claim 6, wherein the filling of the trench with the metal fill comprises physical vapor deposition, chemical vapor deposition or a combination thereof.

8. The method of claim 1, wherein the titanium liner is in direct contact with the contact surface, and the metal fill is in direct contact with the titanium liner, wherein the trench is entirely filled by the titanium liner and the metal fill.

* * * * *